(12) United States Patent
Hayashi et al.

(10) Patent No.: US 11,867,308 B2
(45) Date of Patent: Jan. 9, 2024

(54) PIEZOELECTRIC ACTUATOR AND FLUID CONTROL VALVE

(71) Applicant: HORIBA STEC, Co., Ltd., Kyoto (JP)

(72) Inventors: Shigeyuki Hayashi, Kyoto (JP); Tadahiro Yasuda, Kyoto (JP)

(73) Assignee: HORIBA STEC, Co., Ltd., Kyoto (JP)

( * ) Notice: Subject to any disclaimer, the term of this patent is extended or adjusted under 35 U.S.C. 154(b) by 852 days.

(21) Appl. No.: 16/689,878

(22) Filed: Nov. 20, 2019

(65) Prior Publication Data
US 2020/0185588 A1    Jun. 11, 2020

(30) Foreign Application Priority Data

Dec. 6, 2018    (JP) ................. 2018-229032

(51) Int. Cl.
| | |
|---|---|
| *F16K 31/00* | (2006.01) |
| *H02N 2/00* | (2006.01) |
| *H10N 30/20* | (2023.01) |
| *H10N 30/50* | (2023.01) |
| *H10N 30/80* | (2023.01) |
| *H10N 30/853* | (2023.01) |

(52) U.S. Cl.
CPC ........... *F16K 31/007* (2013.01); *H02N 2/001* (2013.01); *H10N 30/20* (2023.02); *H10N 30/50* (2023.02); *H10N 30/802* (2023.02); *H10N 30/853* (2023.02)

(58) Field of Classification Search
None
See application file for complete search history.

(56) References Cited

U.S. PATENT DOCUMENTS

| | | | |
|---|---|---|---|
| 2004/0178699 A1* | 9/2004 | Nakanishi | H02N 2/0025 310/323.01 |
| 2005/0179342 A1 | 8/2005 | Higuchi et al. | |
| 2017/0020197 A1* | 1/2017 | Cameron | G08B 5/36 |

FOREIGN PATENT DOCUMENTS

| | | |
|---|---|---|
| CN | 1579025 A | 2/2005 |
| CN | 103201047 A | 7/2013 |
| CN | 105370958 A | 3/2016 |
| JP | 04-012679 A | 1/1992 |
| JP | 08-045049 A | 2/1996 |
| JP | 2000508043 A | 6/2000 |
| JP | 2000308372 A | 11/2000 |

(Continued)

OTHER PUBLICATIONS

Translation of WO-9714902-A1 (Year: 2022).*

(Continued)

*Primary Examiner* — Kelsey E Cary
(74) *Attorney, Agent, or Firm* — Alleman Hall Creasman & Tuttle LLP

(57) ABSTRACT

In order to provide a piezoelectric actuator and a fluid control valve that can vaporize a liquid material more effectively than a conventional arrangement, the piezoelectric actuator comprises a piezoelectric stack wherein a piezoelectric ceramic layer and an electrode layer are alternately laminated, a DC voltage application circuit that displaces the piezoelectric stack by applying a DC voltage to at least a part or whole of the piezoelectric stack, and a vibration voltage application circuit that vibrates the piezoelectric stack by applying a voltage having a predetermined frequency or above to at least a part or whole of the piezoelectric stack.

4 Claims, 2 Drawing Sheets

(56) References Cited

FOREIGN PATENT DOCUMENTS

| | | | |
|---|---|---|---|
| JP | 2008010510 A | 1/2008 | |
| JP | 2009531601 A | 9/2009 | |
| JP | 2017104815 A | 6/2017 | |
| TW | 201103678 A | 2/2011 | |
| WO | WO-9714902 A1 * | 4/1997 | .......... F15B 13/0402 |
| WO | 2007123632 A1 | 11/2007 | |
| WO | 2012063951 A1 | 5/2012 | |
| WO | 2018074208 A1 | 4/2018 | |

OTHER PUBLICATIONS

Japan Patent Office, Office Action Issued in Application No. 2018-229032, dated Sep. 27, 2022, 8 pages.
China National Intellectual Property Administration, Office action issued in Chinese Application No. 2019111480575, dated Jan. 18, 2023, 9 pages.
Japan Patent Office, Decision to Grant a Patent issued in Japanese Application No. 2018-229032, dated Jan. 5, 2023, 5 pages.
Taiwan Intellectual Property Office, Office Action and Search Report Issued in Application No. 108143052, dated Oct. 23, 2023, 11 pages.

* cited by examiner

PIEZOELECTRIC ACTUATOR AND FLUID CONTROL VALVE

FIELD OF THE ART

This invention relates to a piezoelectric actuator comprising a piezoelectric stack wherein a piezoelectric ceramic layer and an electrode layer are laminated.

BACKGROUND ART

For example, a process gas that is supplied to a chamber in a process of manufacturing semiconductor is produced by vaporizing a liquid material by providing a bubbling process while introducing a carrier gas. For example, a flow rate or a concentration of the thus produced process gas is controlled by a fluid control valve comprising a piezoelectric actuator arranged in a flow channel (refer to the patent document 1).

PRIOR ART DOCUMENTS

Patent Document

Patent document 1: Japanese Unexamined Patent Application Publication No. 2008-10510

Meanwhile, recently in order to manufacture a more highly functional semiconductor in a recent manufacturing process of the semiconductor, it has been tried to use the process gas whose composition is different from that of a conventional process gas. Since a boiling point of this type of new material is very higher than that of a conventional material, it can be assumed that the liquid material is not fully vaporized by the above-mentioned method for producing the process gas.

SUMMARY OF THE INVENTION

Problems Solved by the Invention

The present claimed invention is to solve the above-mentioned problem, and a main object is to produce a piezoelectric actuator and a fluid control valve that can vaporize the liquid material more effectively than a conventional arrangement.

Means to Solve the Problems

More specifically, a piezoelectric actuator in accordance with this invention is characterized by comprising a piezoelectric stack wherein a piezoelectric ceramic layer and an electrode layer are alternately laminated, a DC voltage application circuit that displaces the piezoelectric stack by applying a DC voltage to at least a part or whole of the piezoelectric stack, and a vibration voltage application circuit that vibrates the piezoelectric stack by applying a voltage having a predetermined frequency or above to at least a part or whole of the piezoelectric stack.

A concept of the voltage whose frequency is more than or equal to a predetermined value described here is not limited to a voltage whose positive and negative are periodically and alternately interchanged such as a sine wave, a rectangular wave and a triangular wave and may include a periodical pulse voltage whose positive and negative are not interchanged. In addition, a concept of the voltage applied in the vibration voltage application circuit is not only the voltage of variable frequency having a fixed frequency wherein a frequency is kept constant but also a voltage such as, for example, a PWM signal whose frequency chronologically changes.

In accordance with this arrangement, it is possible to generate a predetermined displacement for the piezoelectric stack in the DC voltage application circuit and to vibrate the piezoelectric stack while keeping this state. For example, if the piezoelectric actuator having this arrangement is used as the actuator of the fluid control valve, the valve opening position of the valve body that determines a supplying amount of the liquid is controlled by the deviation of the piezoelectric actuator in the DC voltage application circuit and the piezoelectric actuator is vibrated in the vibration voltage application circuit so that it becomes easy to atomize and gasify the liquid that makes contact with the valve body.

In order to coincide a direction of deviation realized by the DC voltage application circuit with a direction of vibration realized by the vibration voltage application circuit with a simple arrangement, the piezoelectric stack may comprise a driving block to be connected to the DC voltage application circuit and a vibration block to be connected to the vibration voltage application circuit, and the driving block and the vibration block may be arranged in a line.

If the vibration voltage application circuit is so configured to apply an AC voltage having a frequency that ultrasonically vibrates the vibration block, it is possible to atomize and splash the liquid that makes contact with an object driven by, for example, the piezoelectric actuator by making use of the vibration.

In order to make it possible to add a vibration function while making a movable range of whole of the piezoelectric stack fully wide, it is preferable that a lamination number of the piezoelectric ceramic layer and the electrode layer of the driving block is much more than that of the vibration block.

As a fluid control valve that can control a supplying amount of the liquid and output the liquid that passes the fluid control valve in an atomized state and that is preferable to be used as, for example, a liquid vaporizer represented is a fluid control valve that comprises a piezoelectric actuator in accordance with this invention, and a valve body that is driven by the piezoelectric actuator and whose position to a valve seat is adjusted, and that is characterized by that the DC voltage application circuit applies the DC voltage to the piezoelectric stack so as to make the position of the valve body to the valve seat at a predetermined position, and the vibration voltage application circuit vibrates the valve body in the vicinity of the predetermined position.

As a concrete application example of the fluid control valve in accordance with this invention represented is an arrangement wherein a liquid is supplied to the valve body and the liquid is atomized by the vibration of the valve body.

Effect of the Invention

In accordance with the piezoelectric actuator of this invention, it is possible to produce a predetermined deviation to the piezoelectric stack by the DC voltage application circuit and to vibrate the piezoelectric stack by the vibration voltage application circuit. Since it is possible for the piezoelectric actuator to realize the deviation and vibration simultaneously, it becomes possible to make it easy to atomize and evaporate the liquid by vibrating the liquid while adjusting the supplying amount of the liquid in case of evaporating the liquid.

MODE FOR EMBODYING THE INVENTION

A piezoelectric actuator 100, a fluid control valve 200 and an atomizer 300 in accordance with one embodiment of this invention will be explained with reference to each drawing.

The atomizer 300 of this embodiment is used to vaporize a liquid material (L) such as an organic compound in, for example, a semiconductor manufacturing process and to produce a process gas.

Figure 1:
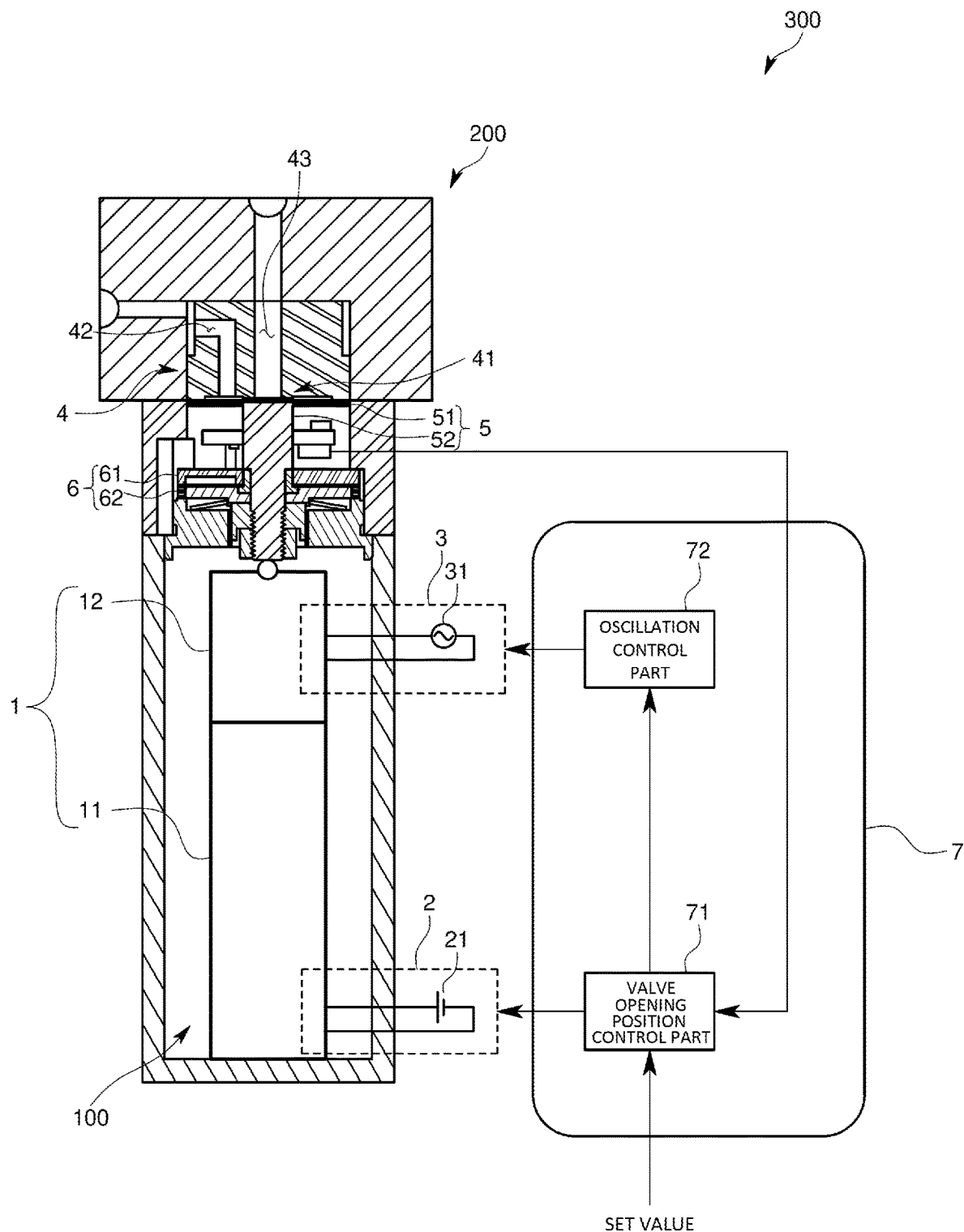
FIG. 1 A schematic diagram showing a piezoelectric actuator, a fluid control valve and an atomizer in accordance with one embodiment of this invention.

The atomizer 300 comprises, as shown in FIG. 1, the fluid control valve 200 whose driving source is the piezoelectric actuator 100 and a control device 7 that controls the movement of the fluid control valve 200.

The fluid control valve 200 comprises a valve sheet body 4 where a valve sheet 41 is formed, a valve body 6 that makes contact with or is separated from the valve sheet 41, the piezoelectric actuator 100 that drives the valve body 5 and a position sensor 6 that detects a position of the valve body 5. The fluid control valve 200 is so configured that the piezoelectric actuator 100 controls a clearance between the valve body 5 and the valve seat 41 and the liquid material (L) that makes contact with the valve body 5 is atomized by making the valve body 5 ultrasonically vibrate. After the liquid material (L) becomes in an atomized state (M), the atomized liquid material (M) is discharged to the outside of the fluid control valve 200. Regarding to the liquid material explained below, the liquid material in the liquid state will be noted as (L) and the liquid material in the atomized state will be noted as (M).

Each component will be explained.

The valve body 4 is generally cylindrical, and comprises an inlet that opens in a side surface of the valve seat body 4 and an outlet that opens in an end surface of the valve seat 41 side, and a first inner flow channel 42 to introduce the liquid material (L) between the valve seat 41 and the valve body 5 and a second inner flow channel 43 where the inlet that penetrates the valve seat 41 is formed and the liquid material (M) atomized by the valve body 5 is discharged outside of the fluid control valve 200 are formed.

Figure 2:
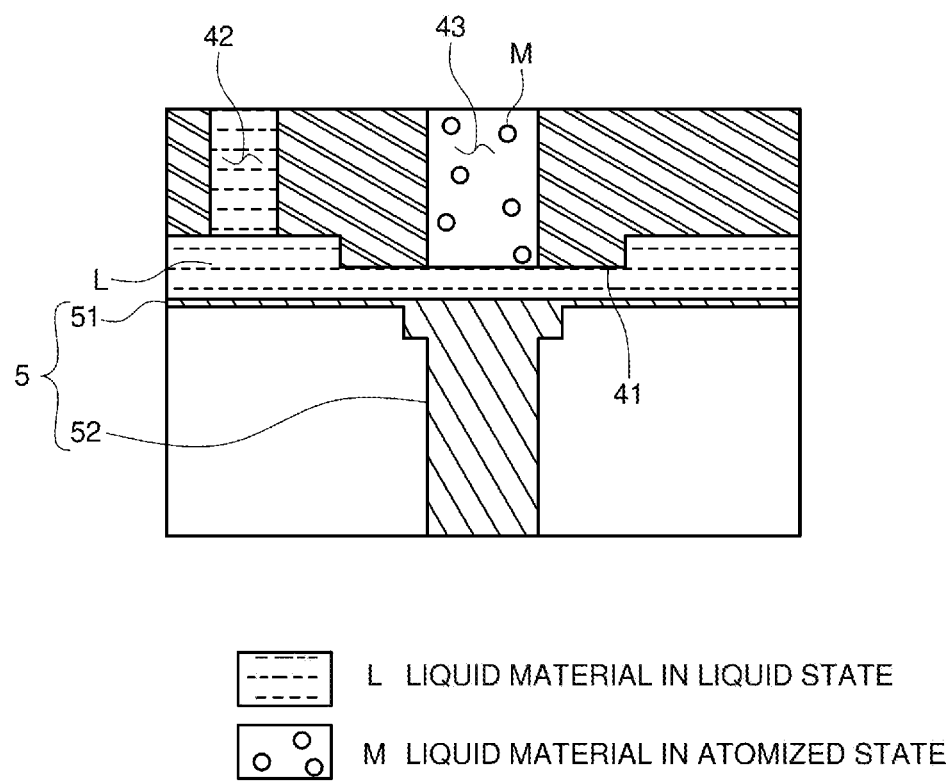
FIG. 2 An enlarged schematic diagram of a valve seat and a valve body of the fluid control valve in accordance with this embodiment.

The valve body 5 comprises a diaphragm 51 arranged to face the valve seat 41 and a plunger 52 formed to project to the piezoelectric actuator 100 side from the center part of the diaphragm 51. The position of the plunger 52 changes in accordance with expansion and contraction of the piezoelectric actuator 100, resulting in change of the clearance between the valve seat 41 and the center of the diaphragm 51. As shown in FIG. 2, a surface of the diaphragm 51 in the valve seat 41 side is arranged to face upward in the vertical direction so that the liquid material (L) makes contact with the surface of the diaphragm 51 due to, for example, gravity.

The piezoelectric actuator 100 comprises a piezoelectric stack 1 wherein a piezoelectric ceramic layer and an electrode layer are alternately laminated. The piezoelectric stack 1 is provided with a driving block 11 and a vibration block 12 each of which has a different usage, and the driving block 1 and the vibration block 12 are arranged in line.

Concretely, the driving block 11 is connected to the DC voltage application circuit 2 and a predetermined DC voltage is applied to the driving block 11. More specifically, the driving block 11 is used to control the clearance between the valve seat 41 and the valve body 5 by keeping a displaced state due to the DC voltage applied to the driving block 11. In addition, as shown in FIG. 1, the driving block 11 is arranged at a more distant position from the valve seat 41 and the valve body 5 than the vibration block 12. Furthermore, a length in an elongation direction of the driving block 11 is longer than that of the vibration block 12, and the lamination number of the piezoelectric ceramic layer and the electrode layer of the driving block 11 is larger than that of the vibration block 12. As this result, displacement that the driving block 11 can produce is bigger than that of the vibration block 12.

The vibration block 12 is connected to the vibration voltage application circuit 3 and a voltage having more than or equal to a predetermined frequency is applied to the vibration block 12. In this embodiment, a voltage having a frequency that can cause ultrasonic vibration to the valve body 5 is applied to the vibration block 12. For example, as the voltage, the AC voltage having the frequency more than or equal to 20 kHz is applied to the vibration block 12 through the vibration voltage application circuit 3. As shown in FIG. 2, vibration is applied to the liquid material (L) supplied between the valve body 5 and the valve seat 41 from the first inner flow channel 42 due to the ultrasonic vibration of the diaphragm 51 of the valve body 5. As this result, the liquid material (L) in the liquid state becomes in the atomized state (M) and then is discharged through the second inner flow channel 43 locating above the diaphragm 51 to the outside.

The position sensor 6 is, as shown in FIG. 1, a deviation sensor of, for example, an electrostatic capacitance type, and comprises a target 61 whose position is fixed in the fluid control valve 200, and a detector 62 that is fixed to the plunger 52 and that moves together with the valve body 5. A position that indicates a size of the clearance between the valve seat 41 and the valve body 5 is detected by the position sensor 6 and a signal indicating the valve opening position is output to the controller 7.

The controller 7 is, so called, a computer comprising a CPU, a memory, an A/D converter, a D/A converter and input/output devices, and produces functions as at least a valve opening position control part 71 and an oscillation control part 72 by executing control programs stored in the memory.

A set value indicating a supply flow rate of the liquid material (L) is set by a user and the valve opening position control part 71 controls an output of the DC power source 21 of the DC voltage application circuit 2 so as to reduce a deviation between a target valve opening position according to the set value and the valve opening position measured by the position sensor 6. For example, after the measured valve opening position coincides with the target valve opening position and is stabilized, feed-back of the measured valve opening position is terminated, and then the control of the DC power supply 21 is switched so as to continue keeping the voltage at this time. In addition, the valve opening position control part 71 outputs an operation permission command to the oscillation control part 72 at a time when the valve opening position feed-back control of the DC power supply 21 is completed.

In case that the operation permission command is input, the oscillation control part 72 operates the AC power supply 31 of the vibration voltage application circuit 3 and ultrasonically vibrates the vibration block 12. More specifically, in this embodiment, the diaphragm 51 is arranged separately from the valve seat 41 at a position according to the set value depending on the deviation of the driving block 11 controlled by the valve opening position control part 71. Then the diaphragm 51 and the plunger 52 vibrate due to the ultrasonic vibration of the vibration block 12 with a position determined by the deviation of the driving block 11 as the center. In this case, amplitude of the vibration is set to be a value smaller than the clearance between the valve seat 41 and diaphragm 51 by the oscillation control part 72, and the diaphragm 51 is controlled not to be interfered with the valve seat 41.

In accordance with the piezoelectric actuator 100, the fluid control valve 200 and the atomizer 300 having the above-mentioned arrangement, it is possible to discharge the liquid material (L) atomized by the ultrasonic vibration of the valve body 5 formed by the vibration block 12 from the second inner flow channel 43 to the outside while controlling an amount of the liquid material (L) supplied by the deviation of the driving block 12.

As a result of this, even though a boiling point of the liquid material is high, it is possible to supply the liquid material in a state of being easily evaporated while keeping the supply amount of the liquid material constant.

Other embodiment will be explained.

In the above-mentioned embodiment, the vibration voltage application circuit applies the AC voltage to the vibration block, however, a voltage whose positive and negative are periodically and alternately interchanged such as a rectangular wave or a triangular wave or a periodical pulse voltage whose positive and negative are not interchanged may be applied to the vibration block. In addition, as one example of the predetermined frequency represented is the frequency that produces the ultrasonic wave vibration, however, the frequency may be lower or higher than the frequency that produces the ultrasonic wave vibration as long as the frequency can atomize the liquid material.

The piezoelectric stack is separated into two blocks as the driving block and the vibration block in the above-mentioned embodiment, however, it may be separated into more than three blocks. For example, the driving block may be further separated into two and the DC voltage application circuit may be connected to each of the blocks respectively. In accordance with this arrangement, even though a dielectric breakdown occurs for one of the driving blocks, is it is possible to displace the valve body to a certain degree so that an abrupt uncontrolled state can be prevented.

In addition, a part of the driving block and a part of the vibration block may overlap in the piezoelectric stack. For example, the vibration voltage may further superimpose in a state wherein the DC voltage is applied to a part or whole of the piezoelectric stacks.

The piezoelectric actuator in accordance with this invention may be used for other than the atomizer.

This invention is not limited to the above-mentioned embodiment, and a part of the embodiment may be modified or a part of each embodiment may be combined without departing from a spirit of the invention.

EXPLANATION OF THE REFERENCE CHARACTERS

300 . . . atomizer
200 . . . fluid control valve
100 . . . piezoelectric actuator
1 . . . piezoelectric stack
11 . . . driving block
12 . . . vibration block
2 . . . DC voltage application circuit
21 . . . DC power supply
3 . . . vibration voltage application circuit
31 . . . AC power supply
4 . . . valve seat body
41 . . . valve seat
42 . . . first inner flow channel
43 . . . second inner flow channel
5 . . . valve body
51 . . . diaphragm
52 . . . plunger
6 . . . position sensor
61 . . . target
62 . . . detector
7 . . . controller
71 . . . valve opening position control part
72 . . . oscillation control part
L . . . liquid material
M . . . atomized liquid material

The invention claimed is:

1. A fluid control valve comprising:
   a piezoelectric actuator comprising:
      a piezoelectric stack wherein a piezoelectric ceramic layer and an electrode layer are alternately stacked,
      a DC voltage application circuit that displaces the piezoelectric stack by applying a DC voltage to at least a part or whole of the piezoelectric stack, and
      a vibration voltage application circuit that vibrates the piezoelectric stack by applying a voltage having a predetermined frequency or above to at least a part or whole of the piezoelectric stack, wherein
   the piezoelectric stack comprises:
      a driving block to be connected to the DC voltage application circuit; and
      a vibration block to be connected to the vibration voltage application circuit,
   the driving block and the vibration block are arranged in a line next to each other along a longitudinal direction of the piezoelectric ceramic layer and the electrode layer,
   the fluid control valve further comprises a valve body that is driven by the piezoelectric actuator and whose position to a valve seat is adjusted,
   the DC voltage application circuit applies the DC voltage to the piezoelectric stack so as to make the position of the valve body to the valve seat at a predetermined position, and
   the vibration voltage application circuit vibrates the valve body in the vicinity of the predetermined position.

2. The fluid control valve actuator described in claim 1, wherein
   the vibration voltage application circuit is so configured to apply an AC voltage having a frequency that ultrasonically vibrates the vibration block.

3. The fluid control valve described in claim 1, wherein a lamination number of the piezoelectric ceramic layer and the electrode layer of the driving block is more than that of the vibration block.

4. The fluid control valve described in claim 1, wherein a liquid is supplied to the valve body and the liquid is atomized by the vibration of the valve body.

* * * * *

UNITED STATES PATENT AND TRADEMARK OFFICE
CERTIFICATE OF CORRECTION

PATENT NO. : 11,867,308 B2
APPLICATION NO. : 16/689878
DATED : January 9, 2024
INVENTOR(S) : Shigeyuki Hayashi and Tadahiro Yasuda It is certified that error appears in the above-identified patent and that said Letters Patent is hereby corrected as shown below:

In the Claims

Column 6, Line 50, Claim 2, delete "actuator"

Signed and Sealed this
Twelfth Day of March, 2024

Katherine Kelly Vidal
*Director of the United States Patent and Trademark Office*